Dec. 2, 1958 N. A. GUSSACK 2,862,772

MOUNTING SLIDE FOR ELECTRONIC CHASSIS

Filed Dec. 17, 1956 2 Sheets-Sheet 1

INVENTOR
Nathan A. Gussack
BY
Irving Seidman
ATTORNEY

Dec. 2, 1958 N. A. GUSSACK 2,862,772

MOUNTING SLIDE FOR ELECTRONIC CHASSIS

Filed Dec. 17, 1956 2 Sheets-Sheet 2

INVENTOR
Nathan A. Gussack
BY
Irving Seidman
ATTORNEY

United States Patent Office 2,862,772

Patented Dec. 2, 1958

2,862,772

MOUNTING SLIDE FOR ELECTRONIC CHASSIS

Nathan A. Gussack, Manhasset, N. Y., assignor to Grant Pulley & Hardware Corporation, Flushing, N. Y., a corporation Application December 17, 1956, Serial No. 628,796

9 Claims. (Cl. 308—3.8)

This invention relates to mounting slides for use in cabinets and, more particularly, to a novel thin slide for mounting an electronic equipment chassis for withdrawal, for inspection and the like, and pivoting through a large arc for access to parts normally inaccessible without complete removal of the chassis from the cabinet.

In the larger installations of electronic equipment, involving a number of units each including a chassis having electronic components mounted thereon and therein, the units are usually mounted in cabinets or on racks. The chassis of each unit is usually mounted in the rack or cabinet on slides so that the unit may be pulled out for inspection, servicing or replacement.

However, it is generally the practice to keep the space occupied by the racks or cabinets at a minimum, and thus the clearance space between the several chassis and the adjacent walls of the rack or cabinet is also a minimum. When it is desired to mount the chassis on slides, the slides can be no thicker than the horizontal clearance between each side of the chassis and the adjacent wall of the rack or cabinet. The small clearance available has hitherto necessitated the use of single slides which, in order to provide adequate support for the chassis when extended, have had only a limited extendability. In turn, this limited extendability has prevented withdrawal of the chassis a sufficient amount to allow full access to all parts of the chassis. A corallary of this is that access to the rear of the chassis must be provided by aisles at the rear of the mounting racks, which means an increase in the floor area required for the installation.

Even where sufficient clearances have been available for installation of double or triple track slides permitting greater extendability, it has still been necessary to remove the chassis from its mounting for access to the rear and bottom of the chassis. Additionally, such double or triple track slides have been relatively bulky, difficult to install, and complicated to operate and maintain.

In accordance with the present invention, the foregoing difficulties and disadvantages are overcome in a novel thin or shallow slide comprising a base securable in a rack or cabinet, an intermediate track movable on spaced pairs of hardened rollers on the base, and a chassis mounting track movable in spaced pairs of hardened rollers on the intermediate track. The two tracks and the base comprise flat plates juxtaposed in surface-to-surface engagement to form an assembly thin enough for mounting in the minimum clearance space provided in chassis mounting racks or cabinets.

The base and the two slides are substantially equal in length to each other and to the depth of the rack or cabinet. As the slide is extended, a latch on the base automatically limits movement of the intermediate track to a position in which it is still firmly supported against vertical deflection by its mounting rollers. A manually releasable catch near the outer end of the intermediate track automatically locks the mounting track against movement in its fully extended position wherein it is still fully supported against vertical deflection by its two pairs of mounting rollers. Upon manual release of this second latch, the mounting track may be pushed inwardly and, in its inward movement, it engages and releases the first latch to allow inward movement of the intermediate track.

A feature of the invention is the novel mounting provision for the chassis. The mounting track has secured along its inner surface a substantially flat guide element having an arcuate guide periphery centered about a pivot stud for the chassis. A block secured to the chassis has a lip engaged behind such guide periphery. By this means, the chassis, in the extended position of the slide, may be pivoted through an arc of substantially 100° to expose its back and rear for inspection and servicing. The guide element also acts as an operator for the manually releasable outer catch during extension of the slide.

For an understanding of the invention principles, reference is made to the following description of a typical embodiment thereof as illustrated in the accompanying drawings. In the drawings.

Figures 1, 2, 3:
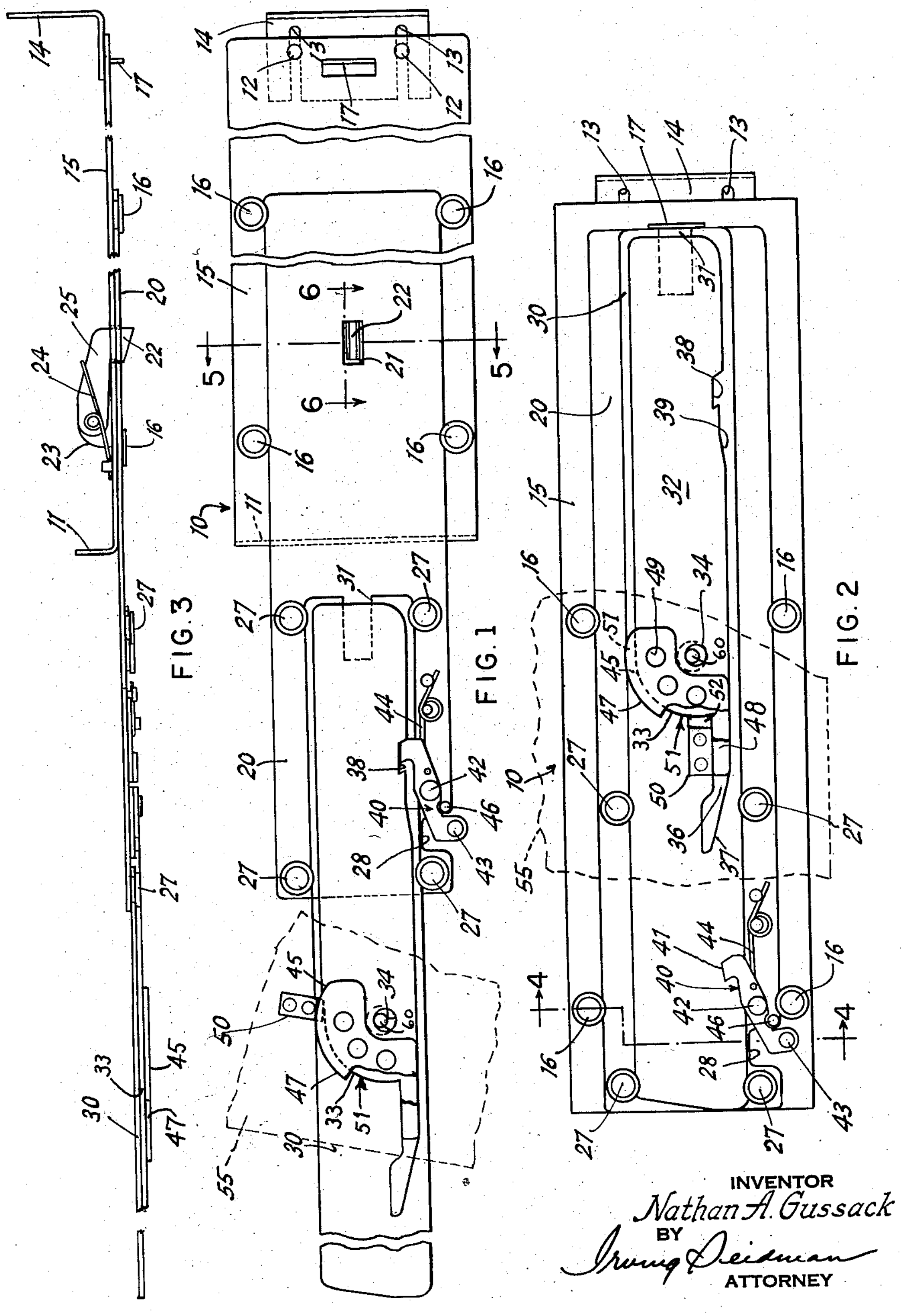
Fig. 1 is an inside elevation view of the extended slide.
Fig. 2 is a similar view of the retracted slide.
Fig. 3 is a top plan view of the extended slide.

Referring to the drawings, the slide 10 comprises a base or mounting plate 15, an intermediate track 20, and a chassis mounting track 30. Base 15 comprises a substantially flat relatively elongated plate having an out turned flange 11 at its front end for securement to the front of the cabinet or rack, and holes 12 at its rear end to receive bolts extending through slots 13 in angle mounting bracket 14 secured to the back of the rack or cabinet. Two spaced pairs of hardened rollers 16 are mounted on the inner surface of plate 15 to support intermediate track 20. An instruck flange 17 adjacent holes 12 serves as a rear stop for tracks 20 and 30.

Figure 6:
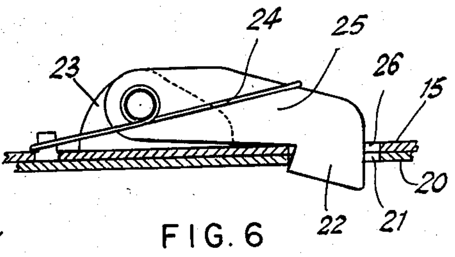
Fig. 6 is a horizontal sectional view on the line 6—6 of Fig. 1.

Intermediate track 20 is a substantially flat plate having a length of the order of that of base 15. Near its rear or inner end, track 20 has a substantially rectangular aperture 21 cooperable with the nose 22 of a latch 25 pivoted in a bracket 23 on the outer surface of base 15 and biased to a latching position by a spring 24. Nose projects through an aperture 26 in base 15. It will be noted that, in the latching position of latch 25, as shown in Figs. 3 and 6, the outer surface of nose 22 slopes rearwardly and inwardly from track 20. Latch 25 engages in aperture 21, upon outward movement of track 20, to lock track 20 relative to base 15, the locking action being effected while track 20 is still fully supported in all four rollers 16.

Adjacent its forward or outer end, track 20 has two pairs of hardened rollers 27 receiving and supporting chassis mounting track or slide element 30. Track 30 is a substantially flat plate having a length of the order of those of base 15 and track 20. For a purpose to be described, track 30 has a short slot 31 in its rear edge, somewhat wider than latch 25 and longitudinally aligned therewith.

An elongated, substantially rectangular, and relatively thin plate 32 is integrally secured, as by spot welding or brazing, in juxtaposed relation to the inner surface of track 30, the horizontal edges of plate 32 being sufficiently inwardly of the horizontal edges of track 30 to clear the flanges of rollers 27. The rear edge of plate 32 extends partly over slot 31 so as to cover the inner end of the slot. At the forward end of plate 32, an arcuate edge 33 extends downwardly from the top edge of the plate and is concentric with a circular aperture 34 through track 30 and plate 32. A narrow finger 36 extends forwardly from the lower end of edge 33, having its lower edge continuous with the lower edge of plate 32 and then formed as an upwardly sloping bevelled surface 37.

Near the rear end of plate 32, its lower edge is formed with a notch 38 having a guide surface 39 extending forwardly therefrom to the lower edge of plate 32. Notch 38 is shaped to cooperate with the latch end 41 of a latch 40 pivoted at 42 to track 20 and having an operating knob 43 adjacent a notch 28 in the lower edge of track 20. A spring 44 biases latch 40 toward its latching position, a pin 46 limiting such movement to the position of Fig. 2. Engagement of end 41 of latch 40 in notch 38 limits outward movement of track 30 to a position in which track 30 is still firmly supported in all four rollers 27. However, track 30 may be released, either for removal from the slide or for inward movement, by manual pressure on knob 43.

An arcuate "pivot plate" 45 is secured, as by spot welding, to the forward inner surface of plate 32 so that its arcuate edge 47 extends beyond and concentric with arcuate edge 33 of plate 32, plate 45 having a finger 48 lying partly along and riveted through finger 36 to track 30. As plate 45 is welded to plate 32 before plate 32 is welded to track 30, plate 45 has apertures 49 for the spot welding electrodes later welding plate 32 to track 30. The spacing of plate 45 from track 30 by plate 32 provides an arcuate groove 51 for a lip 52 on a "pivot block" 50 secured to chassis 55 and riding along edge 47 of pivot plate 45.

To use the slides of the described type to mount a chassis in a rack or cabinet, latches 40 are disengaged to permit release of tracks 30 from slides 20. Brackets 14 are secured in proper horizontally spaced relation on the back of the rack, and the rear ends of bases 15 are loosely attached to the brackets by bolts through apertures 12 and slots 13. Flanges 11 are then attached to the front part of the rack and bases 15 are tightened to brackets 14.

Meanwhile, holes are drilled, at the same location in each side of the chassis, at a distance from the front of the chassis equal to slightly more than one-half the length of the slide. These holes are to receive pivot studs 60 inserted through apertures 34 in tracks 30. Pivot studs 60 are eccentric to apertures 34 to serve as means for levelling the chassis 55 after installation. At a pre-set distance forwardly of the pivot holes, a pair of holes are drilled in each side of the chassis in horizontal alignment with the pivot holes, and each pair of these holes receives bolts securing pivot blocks 50 to the chassis with their lips 52 extending rearwardly. The tracks 30 are then secured to the chassis by engaging lips 52 beneath edge 47 of pivot plate 45 and securing the pivot studs through apertures 34 and the pivot stud holes in the chassis.

The slides 30 attached to the chassis are then inserted in tracks 20 by engagement in roller pairs 27, inward movement being limited by engagement of latches 40 in recesses 38.

By pressing knobs 43, latches 40 are released from notches 38 so that latch ends 41 ride on the lower edges of plates 32 as tracks 30 are moved inwardly. During such inward movement, latch ends 22 ride into slots 31 and are pressed outwardly by plates 32 to release tracks 20 for inward movement. As the chassis is pulled out for inspection, etc., latches 25 and 40 automatically interlock base 15, track 20, and track 30.

Figure 7:
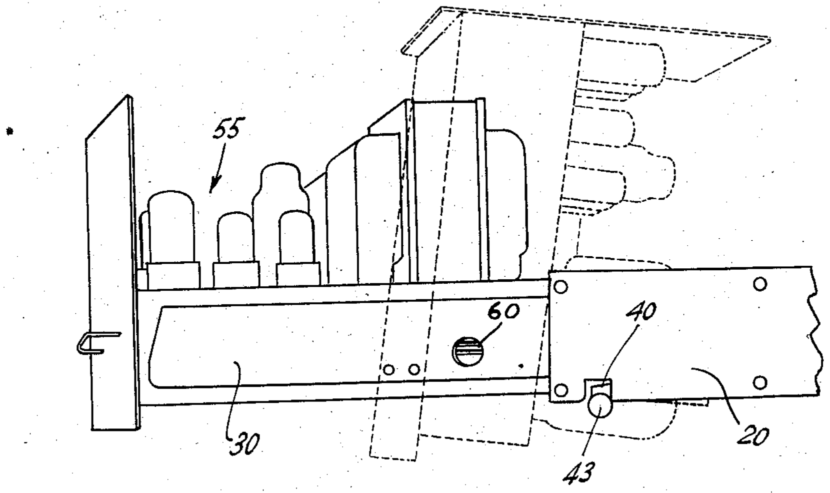
Fig. 7 is a perspective view of the slide mounted in a rack and supporting a chassis.
Figure 4:
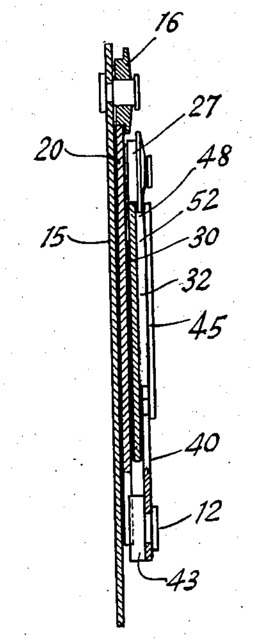
Figs. 4 and 5 are vertical sectional views on the correspondingly numbered lines of Figs. 2 and 1, respectively.
Figure 5:
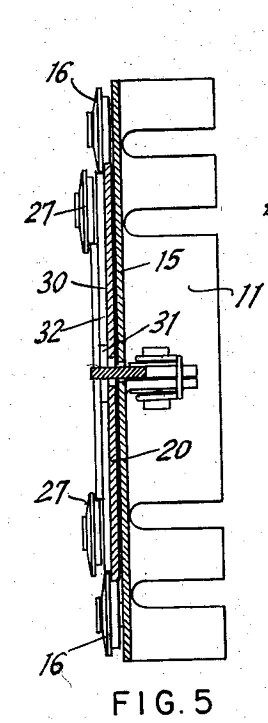

Normally, chassis 55 is horizontally supported by pivot blocks 50 resting on fingers 36 and 48. However, the chassis may be swung substantially 100° to the position shown in dotted lines in Fig. 7, blocks 50 riding along edge 47. This provides for ready access to the back and bottom of the chassis.

While a specific embodiment of the invention has been shown and described in detail to illustrate the application of the invention principles, it will be understood that the invention may be embodied otherwise without departing from such principles.

What is claimed:

1. A slide assembly for supporting a unit in an enclosure such as a rack or cabinet for selective supported withdrawal from the latter, said assembly comprising, in combination, a substantially flat base constructed and arranged for securement in juxtaposed relation to a vertical side surface of the enclosure; longitudinally spaced pairs of vertically spaced rollers on the outer surface of said base; a substantially flat intermediate member supported in said rollers for relative longitudinal movement in juxtaposition to said base; longitudinally spaced pairs of vertically spaced rollers on the outer surface of said intermediate member; a substantially flat slide supported in the rollers on said intermediate member for relative longitudinal movement in juxtaposition to said intermediate member, and constructed and arranged for securement to the unit; a first catch on said base automatically engageable with said intermediate member upon a predetermined extension thereof from said base to lock said intermediate member against movement relative to said base and engaged with all of the base rollers; a second catch on said intermediate member automatically engageable with said slide upon a predetermined extension thereof from said intermediate member, and while still engaged with all the rollers on said intermediate member, to lock said slide against movement relative to said intermediate member; said second catch being manually releasable to provide for removal of said slide or retraction thereof; and means on said slide operable on retraction thereof to release said first catch for retraction of said intermediate member.

2. A slide assembly as claimed in claim 1 in which each of said base, member, and slide comprises a substantially flat, relatively elongated metal plate.

3. A slide assembly as claimed in claim 1 in which each of said base, member, and slide comprises a substantially flat relatively elongated metal plate; and said rollers are engaged with side edges of the plates and have flanges overlying the outer surfaces of the plates.

4. A slide assembly as claimed in claim 1 in which said first catch is pivoted on a vertical axis on the exposed surface of said base, and has an operating end extending through an aperture in said base and engageable in an opening in said intermediate member; said operating end having a sloping edge beyond said opening engageable by said means.

5. A slide assembly as claimed in claim 4 in which said means comprises a notch in the inner edge of said slide aligned with said operating end; and a plate member on the surface of said slide overlying at least the inner end of said notch.

6. A slide assembly as claimed in claim 1 including a pivot pin on side slide securable to the unit; an arcuate guide on said slide concentric with said pin for engagement with a guide shoe secured to the unit; to provide for pivoting of the unit relative to the slide; and stop means on the slide engageable with the guide shoe in the horizontal position of the unit.

7. A slide assembly as claimed in claim 5 in which said second catch is engageable in a notch in a longitudinal edge of said plate member.

8. A slide assembly as claimed in claim 1 including a projection on the inner edge of said base engageable with the inner edges of said intermediate member and said slide.

9. A slide assembly as claimed in claim 6 in which said guide surface includes a plate member on said slide having an arcuate outer edge; and an arcuate plate element overlying said plate member and having an arcuate edge projecting concentrically beyond the arcuate edge of said plate member to form an arcuate groove receiving a lip on a guideblock secured to the unit.

References Cited in the file of this patent

UNITED STATES PATENTS

| | | |
|---|---|---|
| 1,184,978 | Meilink | May 30, 1916 |
| 2,319,555 | Premo | May 18, 1943 |
| 2,486,764 | Singer | Nov. 1, 1949 |
| 2,655,422 | Gussack | Oct. 13, 1953 |